US011583816B2

(12) United States Patent
Lee et al.

(10) Patent No.: US 11,583,816 B2
(45) Date of Patent: *Feb. 21, 2023

(54) GAS DISTRIBUTION PLATE FOR THERMAL DEPOSITION

(71) Applicant: Applied Materials, Inc., Santa Clara, CA (US)

(72) Inventors: Jared Ahmad Lee, San Jose, CA (US); Sanjeev Baluja, Campbell, CA (US); Joseph AuBuchon, San Jose, CA (US); Dhritiman Subha Kashyap, Bangalore (IN); Michael Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 17/466,756

(22) Filed: Sep. 3, 2021

(65) Prior Publication Data
US 2021/0394144 A1    Dec. 23, 2021

Related U.S. Application Data

(63) Continuation of application No. 16/523,252, filed on Jul. 26, 2019, now Pat. No. 11,110,425.

(60) Provisional application No. 62/711,039, filed on Jul. 27, 2018.

(51) Int. Cl.
*H01J 37/32* (2006.01)
*B01J 8/18* (2006.01)
*B01J 4/00* (2006.01)

(52) U.S. Cl.
CPC ....... *B01J 8/1818* (2013.01); *H01J 37/32449* (2013.01); *B01J 4/001* (2013.01)

(58) Field of Classification Search
CPC .... B01J 8/1818; B01J 4/001; H01J 37/32449; C23C 16/45565; C23C 16/4557
USPC ........ 118/715; 156/345.33, 345.34; 716/100; 700/266; 427/248.1
See application file for complete search history.

(56) References Cited

U.S. PATENT DOCUMENTS

| 5,439,524 | A | * | 8/1995 | Cain | H01J 37/32449 |
| | | | | | 156/345.47 |
| 8,142,606 | B2 | * | 3/2012 | Choi | H01L 31/182 |
| | | | | | 118/715 |
| 8,702,867 | B2 | * | 4/2014 | Choi | C23C 16/45565 |
| | | | | | 118/728 |
| 9,082,593 | B2 | * | 7/2015 | Hayashi | C23C 16/503 |
| 2002/0011215 | A1 | * | 1/2002 | Tei | C23C 16/511 |
| | | | | | 118/723 MW |

(Continued)

FOREIGN PATENT DOCUMENTS

KR    20150004771 A    1/2015

OTHER PUBLICATIONS

PCT International Search Report and Written Opinion in PCT/US2019/043626 dated Nov. 15, 2019, 12 pages.

*Primary Examiner* — Rudy Zervigon
(74) *Attorney, Agent, or Firm* — Servilla Whitney LLC

(57) ABSTRACT

Apparatus and methods for providing high velocity gas flow showerheads for deposition chambers are described. The showerhead has a faceplate in contact with a backing plate that has a concave portion to provide a plenum between the backing plate and the faceplate. A plurality of thermal elements is within the concave portion of the backing plate and extends to contact the faceplate.

18 Claims, 7 Drawing Sheets

(56) References Cited

U.S. PATENT DOCUMENTS

| | | | |
|---|---|---|---|
| 2003/0205202 A1* | 11/2003 | Funaki | C23C 16/45565 |
| | | | 118/723 E |
| 2006/0228496 A1* | 10/2006 | Choi | H01J 37/3244 |
| | | | 118/715 |
| 2008/0305246 A1* | 12/2008 | Choi | C23C 16/45565 |
| | | | 118/728 |
| 2010/0006031 A1* | 1/2010 | Choi | C23C 16/45565 |
| | | | 118/723 R |
| 2010/0136216 A1* | 6/2010 | Tsuei | C23C 16/45565 |
| | | | 427/9 |
| 2011/0048325 A1* | 3/2011 | Choi | C23C 16/45574 |
| | | | 118/712 |
| 2011/0180233 A1 | 7/2011 | Bera et al. | |
| 2012/0247673 A1* | 10/2012 | Hayashi | C23C 16/509 |
| | | | 313/352 |
| 2015/0004798 A1 | 1/2015 | Chandrasekharan et al. | |
| 2015/0011095 A1 | 1/2015 | Chandrasekharan et al. | |
| 2016/0086776 A1 | 3/2016 | De La Llera et al. | |
| 2018/0087155 A1 | 3/2018 | Subramani et al. | |

* cited by examiner

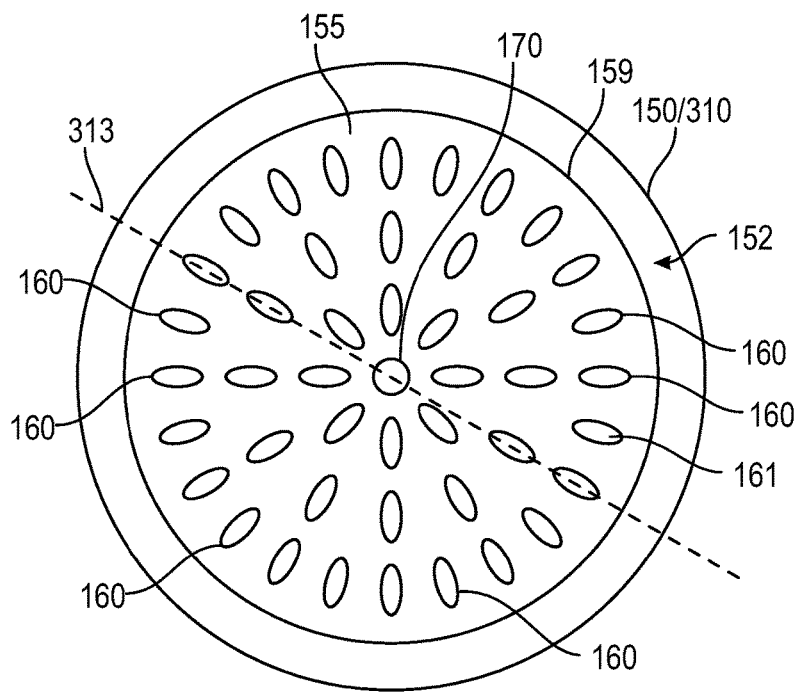
FIG. 10
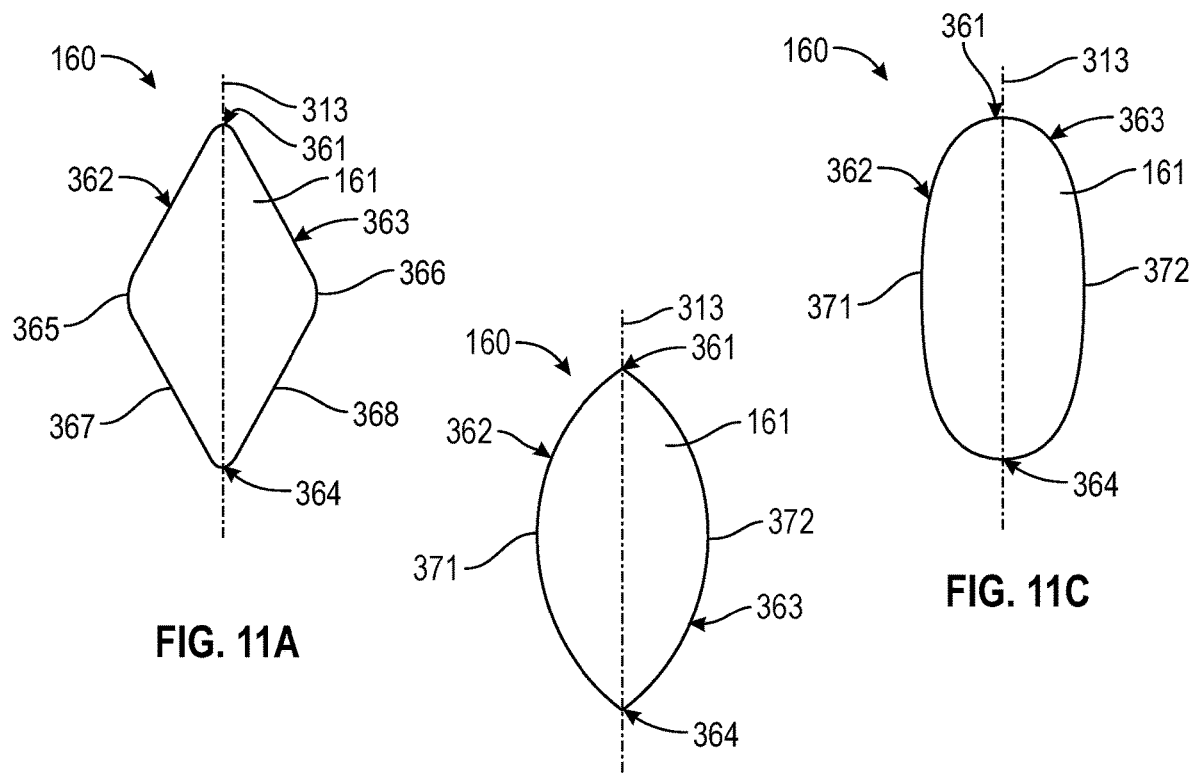
FIG. 11A
FIG. 11B
FIG. 11C

GAS DISTRIBUTION PLATE FOR THERMAL DEPOSITION

CROSS-REFERENCE TO RELATED APPLICATIONS

This application is a continuation of U.S. patent application Ser. No. 16/523,252, filed Jul. 26, 2019, which claims priority to U.S. Provisional Application No. 62/711,039, filed Jul. 27, 2018, the entire disclosure of which is hereby incorporated by reference herein.

TECHNICAL FIELD

Embodiments of the disclosure are directed to gas distribution plates for semiconductor processing chambers. In particular, embodiments of the disclosure are directed to high gas switching speed showerheads with face temperature uniformity.

BACKGROUND

Gas-phase deposition processes (e.g., chemical vapor deposition, atomic layer deposition) require fast cycle times in order to achieve high throughput. A challenge in that area is quickly introducing and removing incompatible precursors so reactive chemistries do not interact at the wrong time (i.e., in the gas phase) causing non uniform deposition. Typically, deposition using gas distribution assemblies with high velocity and low conductance sacrifices flow uniformity and deposition uniformity.

In addition good showerhead thermal uniformity is required to achieve on wafer deposition uniformity. Existing showerheads do not provide high velocity with low conductance or temperature uniformity. Therefore, there is a need in the art for new showerhead designs that provide good flow uniformity and temperature control.

SUMMARY

One or more embodiments of the disclosure are directed to gas distribution plates comprising a faceplate and a backing plate. The faceplate has a front surface and a back surface defining a thickness. A plurality of apertures extends through the thickness. The backing plate has a front surface and a back surface defining a thickness. The front surface is in contact with the back surface of the faceplate. The front surface of the backing plate includes a concave portion to form a plenum bounded by the concave portion and the back surface of the faceplate. A plurality of thermal elements extends from the concave portion to contact the back surface of the faceplate.

Additional embodiments of the disclosure are directed to processing chambers comprising a substrate support having a support surface and a gas distribution plate as described herein. A control is connected to the processing chamber and/or gas distribution plate. The controller has one or more configurations selected from: a configuration to provide a flow of gas to the gas distribution plate, a configuration to control a temperature of the gas distribution plate, a configuration to control a temperature of the substrate support or a configuration to move and/or rotate the substrate support.

Further embodiments of the disclosure are directed to methods of processing a substrate. The temperature of a gas distribution plate is controlled. The gas distribution plate has a faceplate with a front surface and a back surface defining a thickness, and a plurality of apertures extending through the thickness. The gas distribution plate has a backing plate with a front surface and a back surface defining a thickness. The front surface is in contact with the back surface of the faceplate. The front surface of the backing plate includes a concave portion to form a plenum bounded by the concave portion and the back surface of the faceplate. A plurality of thermal elements extends from the concave surface of the concave portion and contacts the back surface of the faceplate. A gas is flowed into the plenum in the gas distribution plate.

Additional embodiments of the disclosure are directed to non-transitory computer readable medium. The non-transitory computer readable medium including instructions, that, when executed by a controller of a processing chamber, cause the processing chamber to perform operations of one or more of: controlling a temperature of a gas distribution plate and/or controlling a flow of gas into the plenum of the gas distribution plate. The gas distribution plate having a faceplate with a front surface and a back surface defining a thickness, and a plurality of apertures extending through the thickness. The gas distribution plate having a backing plate with a front surface and a back surface defining a thickness. The front surface is in contact with the back surface of the faceplate. The front surface of the backing plate includes a concave portion to form a plenum bounded by the concave portion and the back surface of the faceplate. A plurality of thermal elements extends from a concave surface of the concave portion and contact the back surface of the faceplate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 10 is a schematic front view of a plenum plate in accordance with one or more embodiment of the disclosure; and FIGS. 11A through 11C are schematic front views of thermal elements in accordance with one or more embodiments of the disclosure.

DETAILED DESCRIPTION

Figure 1:
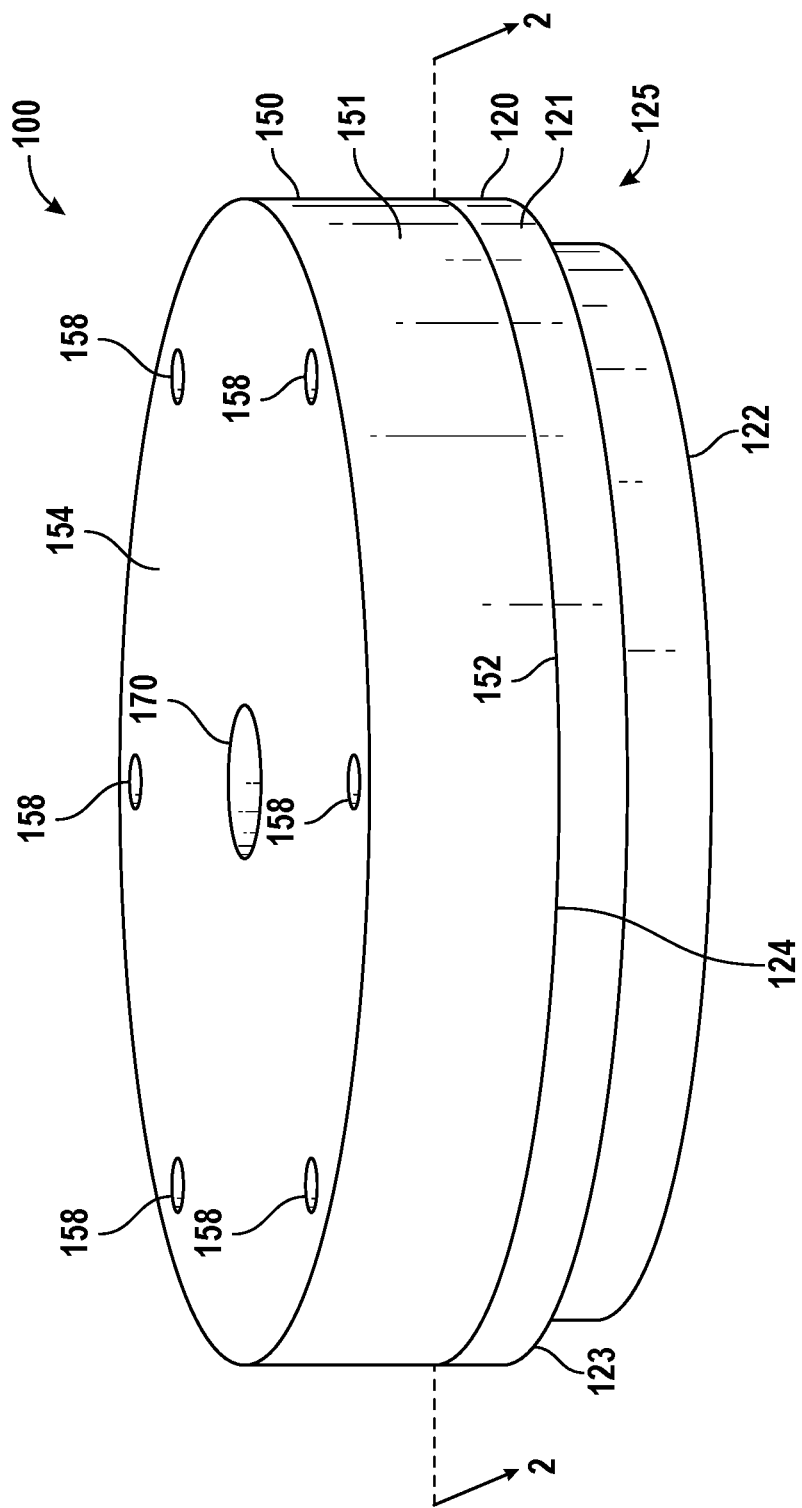
FIG. 1 is a perspective view of a gas distribution plate in accordance with one or more embodiment of the disclosure.

Embodiments of the disclosure are directed to showerheads for fast cycle processes. Embodiments of the disclosure provide high gas velocity showerheads for fast gas switching with temperature uniformity. This is enabled by a low cross sectional flow area throughout the gas distribution paths for high gas velocity. Good temperature uniformity is created by having high conductivity heat transfer paths periodically across the gas plenum.

Gas flow uniformity across the wafer surface can be created by determining the size and number of gas feed holes through the faceplace. Temperature uniformity can be created by providing a plurality of periodic heat transfer elements between the thin showerhead and the thick temperature controlled plate adjacent (above) to the showerhead face plate. Some embodiments of the disclosure utilize different numbers of holes and/or different sizes of holes to uniformly distribute gas to the wafer.

Existing showerheads with high velocity gas flow for fast gas speed do not have heat transfer elements to enable the heat typically transferred to the faceplate to flow to the adjacent cooling plate. In the case where heat is being added to the faceplate, this heat typically conducts horizontally along the thin faceplate material. Heat flows from high temperature to low temperature areas. This means that the center of the faceplate is hotter than the edge. If the wafer is lower temperature than the faceplate and heat is leaving the faceplate, then the center of the showerhead will be colder than the edge (without the thermal elements).

Embodiments of the present disclosure balance conductance and uniformity by using a conical plenum shape to spread the flow evenly to relatively large injection holes. Internal heat transfer elements are used to address the adverse thermal uniformity effects of the typical plenum. The size, number, and pattern of the heat transfer elements shunts the heat to the temperature controlled back plate. The design is currently fabricated by diffusion bonding the faceplate to the backing plate (thick, temperature controlled, structural to hold the forces generated from vacuum). The design could also be brazed or possibly fabricated with metal 3D printing.

Embodiments of the disclosure advantageously provide low conductance for high gas throughput. Some embodiments advantageously provide good flow uniformity with conical plenum shape and variable density or size of gas holes. Some embodiments advantageously improve the thermal uniformity of the showerhead by incorporating internal heat transfer elements. Some embodiments advantageously provide a bonding method that does not introduce materials that are incompatible with semiconductor process. Some embodiments of the disclosure are directed to bonded showerheads with an internal conical plenum and a plurality of periodic internal heat transfer elements to improve thermal uniformity.

In some embodiments, the heat transfer elements comprise columnar connections between the showerhead faceplate and the structural and temperature controlled backing plate. In use, the faceplate is located parallel to the wafer so that the faceplate distributes gases to the wafer. The structural backing plate can be attached to the faceplate. The backing plate can have heaters and/or cooling to provide temperature control.

Figure 2:
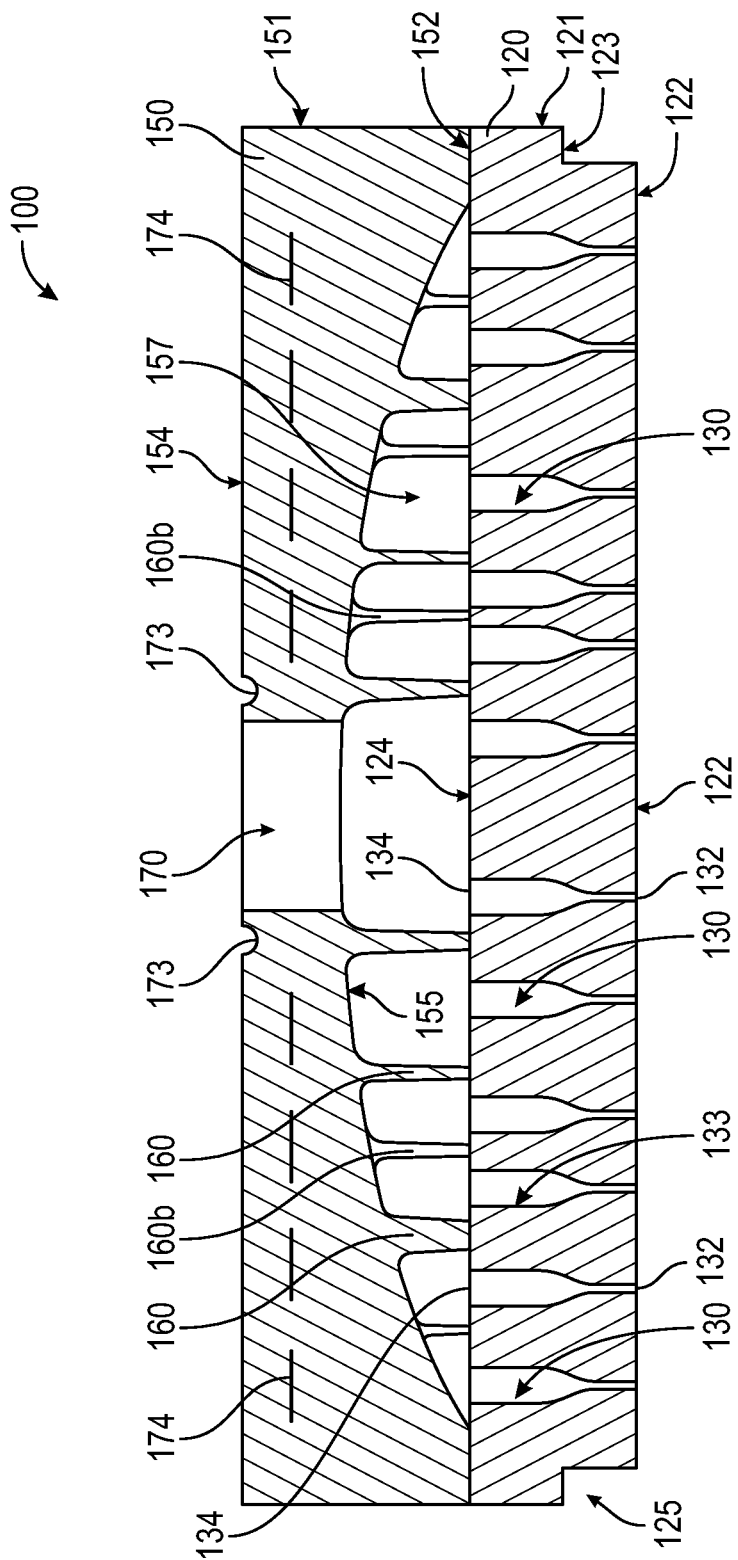
FIG. 2 is a cross-sectional view of the gas distribution plate of FIG. 1 taken along line 2-2.

Referring to FIGS. 1 and 2, one or more embodiments of the disclosure are directed to gas distribution plates 100. FIG. 1 illustrates an isometric view of a gas distribution plate 100 and FIG. 2 illustrates a cross-sectional view of the gas distribution plate 100 of FIG. 1 taken along line 2-2.

The gas distribution plate 100 includes a faceplate 120 and a backing plate 150. The illustrated embodiment shows the faceplate 120 connected to the backing plate 150. The faceplate 120 of some embodiments is bonded to the backing plate 150 by brazing with a suitable material including, but not limited to, alloys of copper and zinc, by a diffusion bond, by welding or by soldering with any suitable material.

Figure 7:
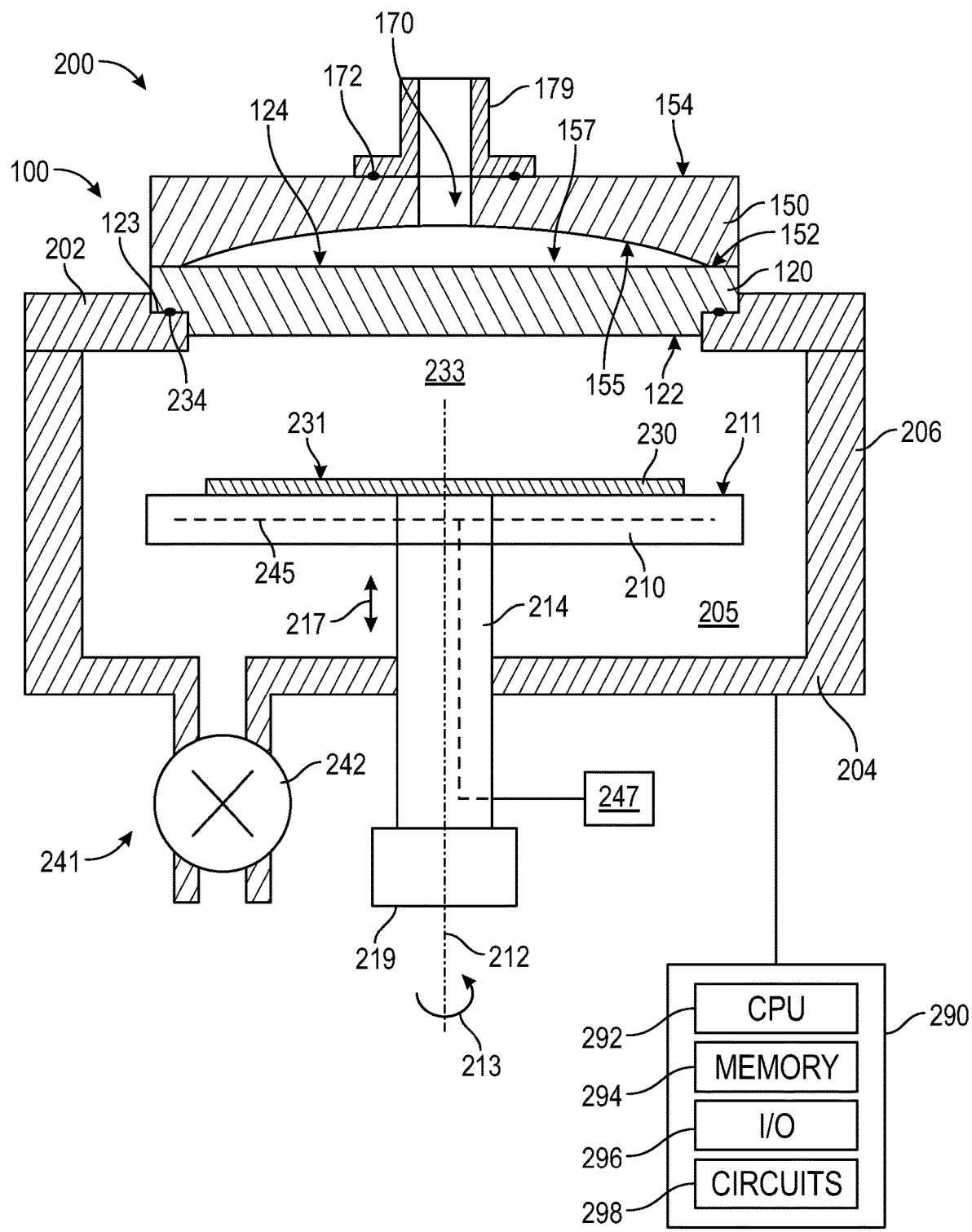
FIG. 7 is a schematic view of a processing chamber in accordance with one or more embodiment of the disclosure.

The faceplate 120 in the illustrated embodiment has an outer peripheral face 121, a front surface 122 and a back surface 124. The thickness of the faceplate 120 is defined as the distance between the front surface 122 and the back surface 124. In the faceplate of the embodiment of FIG. 1, the outer peripheral face has a stepped portion 125 with a sealing surface 123. The stepped portion 125 of some embodiments provides surfaces to cooperatively interact with other components (e.g., a process chamber lid) to form a larger structure (e.g., a processing chamber). The sealing surface 123 can include one or more channel (not shown) to allow for inclusion of an o-ring 172 (as shown in FIG. 7) to help maintain a gas-tight seal.

Figure 3:
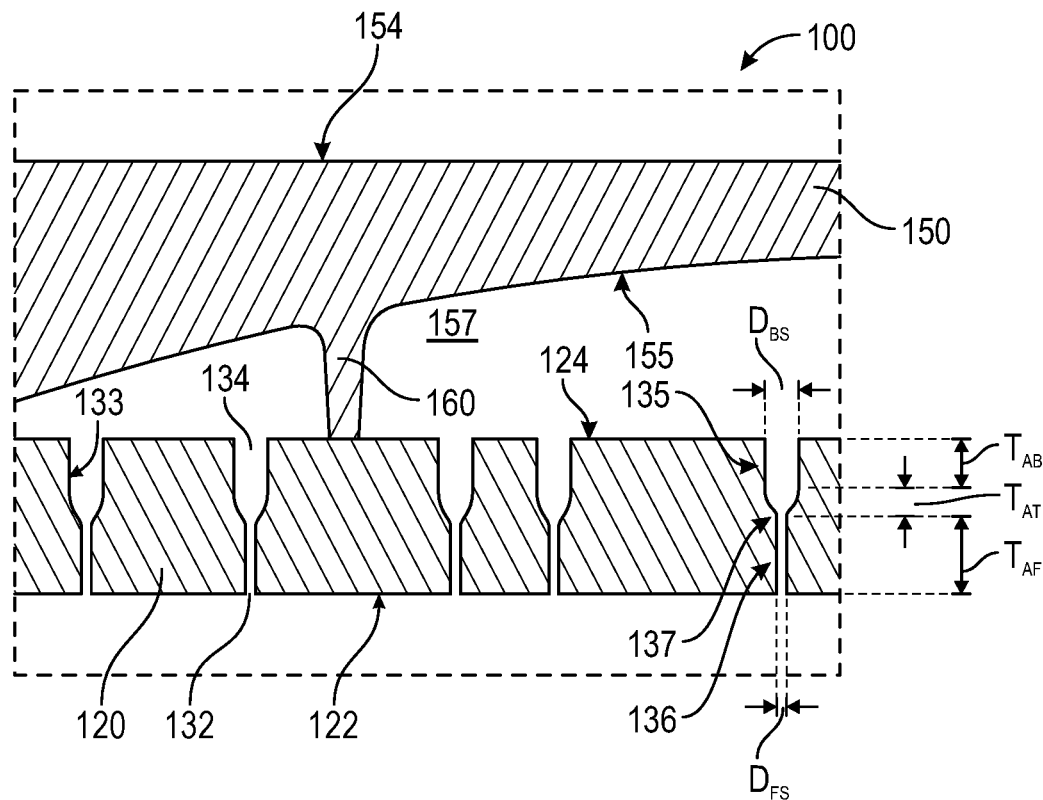
FIG. 3 is a cross-sectional expanded view of a portion of a gas distribution plate according to one or more embodiment.

The faceplate 120 includes a plurality of apertures 130 that extend through the thickness of the faceplate 120. Referring to FIGS. 2 and 3, the plurality of apertures 130 extending through the faceplate 120 have an opening 132 in the front surface 122 and an openings 134 in the back surface 124. The size and shapes of the apertures can be uniform or can vary so that shape and/or size of each aperture 130 is independent of the shape and/or size of adjacent apertures 130.

The openings 132 in the front surface 122 have a front surface diameter $D_{FS}$ and the openings 134 in the back surface 124 have a back surface diameter $D_{BS}$. The front surface diameter $D_{FS}$ and back surface diameter $D_{BS}$ of some embodiments are substantially the same so that the sidewalls 133 of the apertures 130 are parallel. In some embodiments, the apertures 130 have parallel sidewalls and extend substantially perpendicular to the front surface 122 and back surface 124. The diameters of the openings 134 can vary depending on, for example, the use of the gas distribution plate 100. For example, for chemical vapor deposition (CVD) processes, the openings of some embodiments are smaller than for atomic layer deposition (ALD) processes.

In some embodiments, as shown in FIGS. 2 and 3, the front surface diameter and back surface diameters are different. In the illustrated embodiment, the back surface diameter $D_{BS}$ is greater than the front surface diameter $D_{FS}$ so that the apertures 130 taper (either straight or curved) from the back surface 124 to the front surface 122. Stated differently, in some embodiments, the front surface diameter $D_{FS}$ is smaller than the back surface diameter $D_{BS}$.

The apertures 130 shown in the Figures have a back portion 135 and a front portion 136 (see FIG. 3). A transition portion 137 is between the back portion 135 and the front portion 136. In the illustrated embodiment, the sidewalls 133 of the apertures 130 are parallel in the back portion 135 and in the front portion 136. The diameter of the apertures 130 in the back portion 135 is larger than the diameter in the front portion 136 so that the transition portion 137 is shaped to connect the front portion 136 to the back portion 135. The skilled artisan will recognize that the particular shape of the transition portion 137 can be any suitable shape including, but not limited to, a funnel-like linear taper, an ogee-shaped taper or a flat surface perpendicular to the sidewalls 133. The length of the transition portion $T_{AT}$ can vary based on the length of the front portion $T_{AF}$ and the length of the back portion $T_{AB}$.

Referring back to FIGS. 1 and 2, the backing plate 150 of some embodiments has an outer peripheral edge 151, a front surface 152 and a back surface 154. The thickness of the backing plate is defined from the front surface 152 to the back surface 154. The embodiment illustrated in FIG. 1 includes a plurality of openings 158 to allow for placement of one or more of sensors, electrical connections, or fasteners.

Referring to FIG. 2, in some embodiments, the front surface 152 of the backing plate 150 including a concave portion 155 in a center of the backing plate 150. The concave portion 155 forms a plenum 157 bounded by the concave portion 155 of the front surface 152 and the back surface 124 of the faceplate 120.

A plurality of thermal elements 160 extends from the concave surface of the concave portion 155 to contact the back surface 124 of the faceplate 120. The thermal elements 160 provide improved thermal conductivity between the backing plate 150 and the faceplate 120. In the embodiment illustrated in FIG. 2, some of the thermal elements 160 behind the plane of line 2-2 are illustrated. These thermal elements are labeled with reference numeral 160b to show the differences.

The numbers of thermal elements 160 can vary depending on, for example, the diameter of the concave portion 155, the substrate being processed or the thermal conductivity of the process gases. The number of thermal elements in FIG. 2 should not be taken as limiting the scope of the disclosure. In some embodiments with a backing plate 150 sized to process 300 mm wafers, there are in the range of about 50 to about 750 thermal elements, or in the range of about 100 to about 500 thermal elements, or in the range of about 150 to about 400 thermal elements, or in the range of about 200 to about 300 thermal elements.

Figure 4:
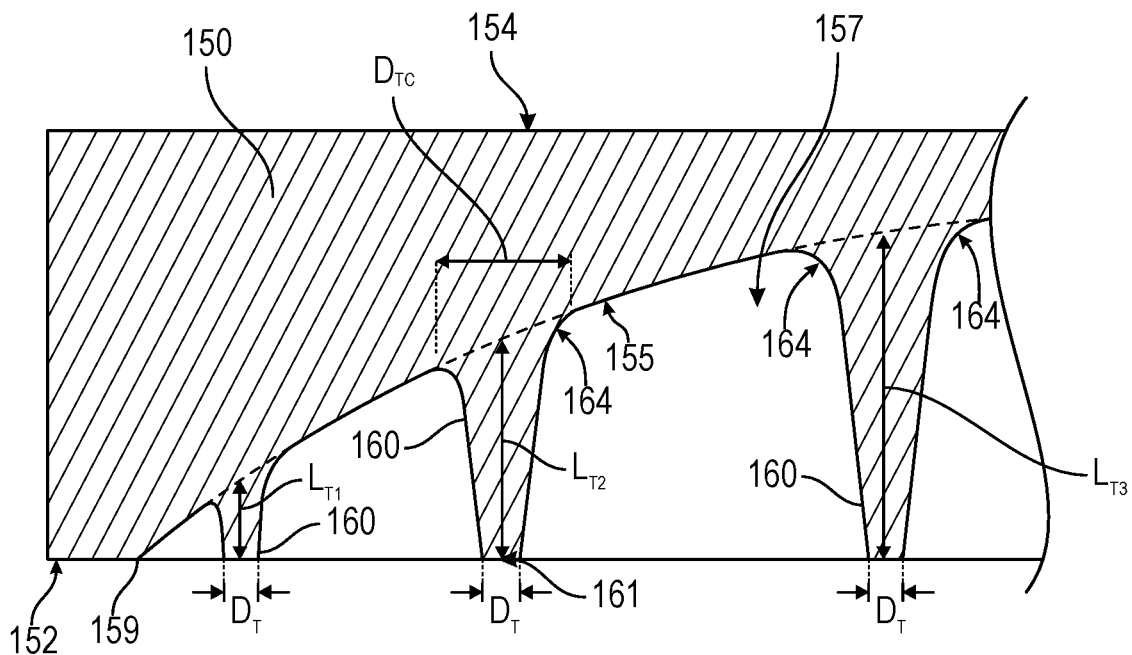
FIG. 4 is a partial cross-sectional view of a backing plate in accordance with one or more embodiment of the disclosure.

FIG. 4 shows a portion of a backing plate 150 in accordance with one or more embodiment of the disclosure. The curvature of the concave portion 155 is exaggerated for descriptive purposes and should not be taken as limiting the scope of the disclosure. The thermal elements 160, three of which are shown in FIG. 4, according to some embodiments, have independent lengths LT. For descriptive purposes the shortest thermal element has a length labeled LT1, the middle length thermal element 160 has a length labeled LT2 and the longest thermal element 160 has a length labeled LT3. It will be readily understood that three lengths are shown for descriptive reasons and that the disclosure is not limited to three different length thermal elements.

In some embodiments, the thermal elements 160 located equidistant from a center line (see FIG. 5) have substantially the same length LT. As used in this manner, the term "substantially the same" means that the lengths are with ±5%, ±2% or ±1% of the average length of equidistant thermal elements.

The thermal elements 160 extend to a front surface 161 of the thermal element 160. The width or diameter $D_T$ of the front surfaces 161 of the various thermal elements 160 of some embodiments are substantially the same. As used in this manner, the term "substantially the same" means that the diameters of the front surfaces 161 are with ±5%, ±2% or ±1% of the average diameter of the thermal elements 160. In some embodiments, the front surfaces 161 of the thermal elements 160 have independent diameters.

According to some embodiments, the front surfaces 161 of the thermal elements 160 are substantially coplanar. As used in this manner, the term "substantially coplanar" means that the surfaces are within ±0.05 mm, 0.04 mm, 0.03 mm, 0.025 mm, 0.02 mm, 0.015 mm or 0.0125 mm of a plane formed averaging all of the surfaces.

In some embodiments, as shown in FIG. 4, each of the thermal elements 160 has a tapered profile with a flared base 164 at the concave surface of the concave portion 155 and a narrower end at the front surface 161. As shown in FIG. 4, the thermal element has a diameter $D_{TC}$ at the concave surface that is larger than the diameter $D_T$ at the front surface 161. In some embodiments, the concave portion 155 has a concave portion diameter $D_C$ less than an outer peripheral diameter $D_P$ of the backing plate 150 to provide a sealing surface at the outer front face ring 153. In some embodiments, the sealing surface provides a contact point to the faceplate 120. In some embodiments, the backing plate 150 is bonded to the faceplate 120 at the sealing surface. In some embodiments, the backing plate 150 is bonded to the faceplate 120 at the front surface 161 of the thermal elements 160. In some embodiments, the backing plate 150 is bonded to the faceplate 120 at the sealing surface of the outer front face ring 153 and at the front surface 161 of the thermal elements 160.

Figure 9:
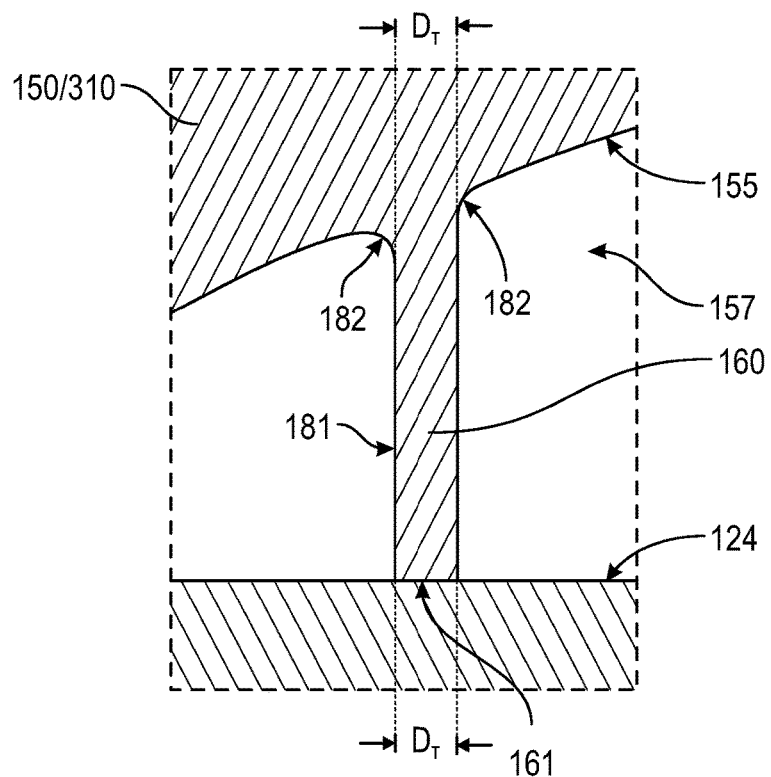
FIG. 9 is an expanded view of region 9 in FIG. 4 shown a thermal element in accordance with one or more embodiment of the disclosure.

FIG. 9 illustrates an expanded portion of region 9 of FIG. 4 illustrating an alternate embodiment of the backing plate 150 (or plenum plate 310, as described below). In the embodiment of FIG. 9, the thermal elements 160 have a substantially uniform diameter $D_T$ from the concave portion 155 to the front surface 161. In some embodiments, the thermal elements 160 extend directly from the concave portion 155 creating a hard angle at the point of extension. In some embodiments, as illustrated in FIG. 9, the thermal element 160 has a radiused portion 182 at the portion of the thermal element 160 at the concave portion 155 so that the transition from the concave portion 155 to the sidewall 181 of the thermal element 160 is slightly tapered.

Figure 5:
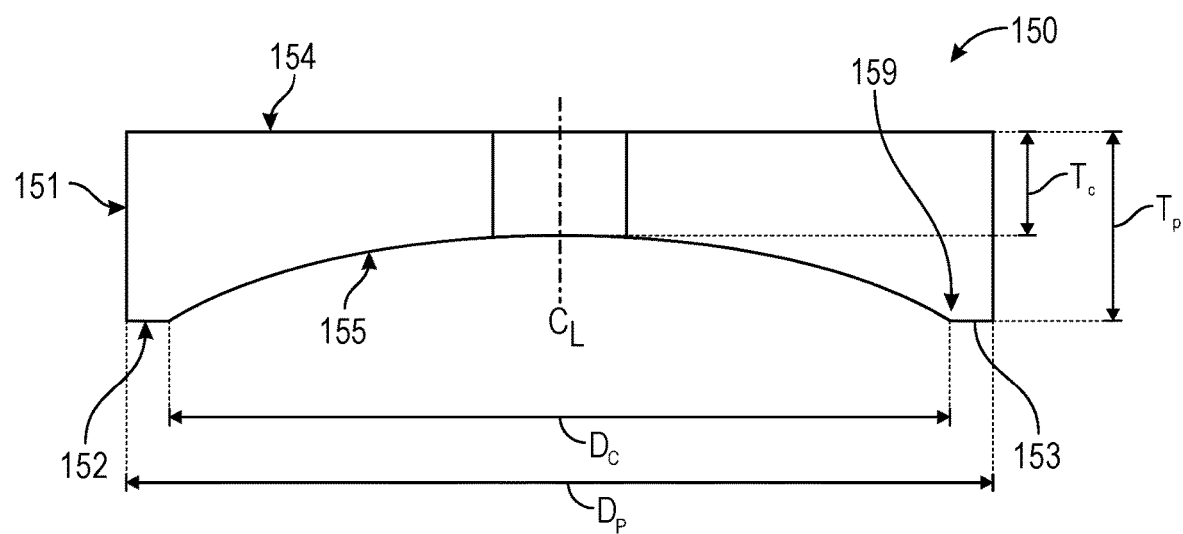
FIG. 5 is a schematic cross-sectional view of a backing plate in accordance with one or more embodiment of the disclosure.
Figure 6:
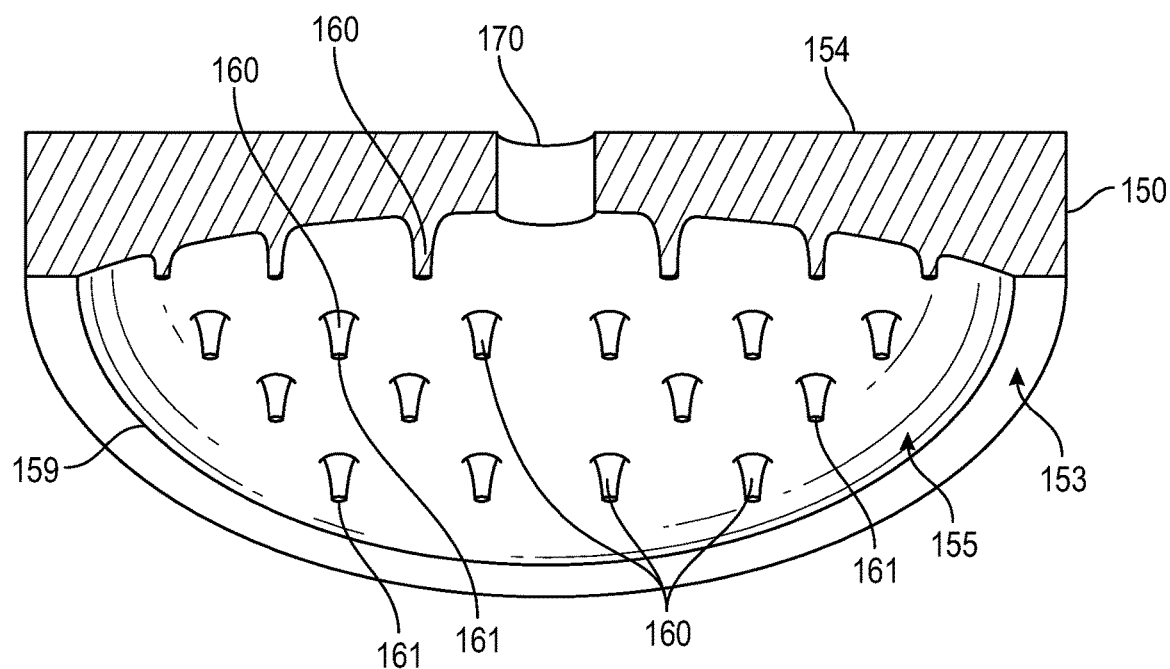
FIG. 6 is a cross-sectional bottom perspective view of a backing plate in accordance with one or more embodiment of the disclosure.

Referring to FIGS. 5 and 6, in some embodiments the backing plate 150 has an outer peripheral edge 151 and the concave portion 155 has an outer peripheral edge 159. In some embodiments, the diameter $D_P$ of the backing plate at the outer peripheral edge 151 is greater than the diameter $D_C$ of the concave portion 155 so that an outer front face ring 153 is formed at the front surface 152 of the backing plate 150. In some embodiments, the outer front face ring 153 is substantially flat. As used in this manner, the term "substantially flat" means that a plane formed by the surface is no more than 2, 1 or 0.5 mm from the surface of the outer front face ring 153. In some embodiments, the front surface 152 of the backing plate 150 at the outer front face ring 153 is substantially coplanar with the front surfaces 161 of the thermal elements 160.

Referring to FIG. 5, the concave portion diameter $D_C$ of some embodiments is greater than or equal to about 90% of the outer peripheral diameter $D_P$. In some embodiments, the concave portion diameter $D_C$ is greater than or equal to about 70%, 75%, 80%, 85%, 95% or 98% of the outer peripheral diameter $D_P$. In some embodiments, the concave portion diameter $D_C$ is less than or equal to about 100%, 99%, 98%, 95%, 90%, 85% or 80% of the outer peripheral diameter $D_P$.

Referring again to FIG. 2, the backing plate 150 of some embodiments further comprises a gas inlet 170. The gas inlet 170 provides fluid communication between the back surface 154 of the backing plate 150 and the plenum 157 formed between the backing plate 150 and the faceplate 120. In some embodiments, a groove 171 is formed around the gas inlet 170 for an o-ring 172 (see FIG. 7).

In some embodiments, the backing plate 150 further comprises a thermal control component 174 within a body of the backing plate 150. The thermal control component 174 is any suitable component or components known to the skilled artisan that can change the temperature of the backing plate 150. Suitable thermal control components include, but are not limited to, resistive heaters, coolers (e.g., a Peltier device) or channels to allow a heating or cooling fluid to flow through the backing plate 150. The thermal control component 174 of some embodiments controls a temperature of the backing plate 150 and the faceplate 120 due to the thermal elements.

The backing plate 150 and faceplate 120 can be made from the same material or different materials. In some embodiments, one or more of the backing plate or faceplate comprises aluminum. In some embodiments, one or more of the backing plate or faceplate comprises aluminum with an oxide coating.

With reference to FIG. 7, some embodiments of the disclosure are directed to processing chambers 200 including the gas distribution plate 100. The processing chamber 200 comprises a top 202, bottom 204 and at least one sidewall 206 enclosing an interior volume 205. The gas distribution plate 100 of some embodiments is positioned within an opening in the top 202 so that sealing surface 123 of the faceplate 120 is on the top 202. The illustrated embodiment includes an o-ring 234 between the top 202 and the sealing surface 123. The o-ring 234 can be in a groove formed in one or more of the top 202 or sealing surface 123. An inlet flange 179 is connected to the gas inlet 170 to provide a connection for a gas supply. The inlet flange 179 forms a gas-tight seal with the gas inlet 170 using o-ring 172 which can be in a groove 173 in the backing plate 150 (see FIG. 2).

A substrate support 210 is in the interior volume 205 of the processing chamber 200. The substrate support 210 of some embodiments is connected to a support shaft 214. The support shaft 214 can be integrally formed with the substrate support 210 or can be a separate component than the substrate support 210. The support shaft 214 of some embodiments is configured to rotate 213 around a central axis 212 of the substrate support 210. The illustrated embodiment includes a substrate 230 on the support surface 211 of the substrate support 210. The substrate 230 has a substrate surface 231 that faces the front surface 122 of the faceplate 120. The space between the support surface 211 and front surface 122 of the faceplate 120 may be referred to as a reaction space 233. Gases from the interior volume 205 and/or reaction space 233 can be evacuated through exhaust 241.

In some embodiments, the support shaft 214 is configured to move 217 the support surface 211 closer to or further away from the front surface 222 of the faceplate 120. To rotate 213 or move 217 the support surface 211, the processing chamber 200 of some embodiments includes one or more motors 219 configured for one or more rotational or translational movement. While a single motor 219 is illustrated in FIG. 7, the skilled artisan will be familiar with suitable motors and suitable arrangements of components to execute the rotational or translational movements.

The substrate support 210 of some embodiments includes a heater 245 within the substrate support 210. The heater 245 can be any suitable heater known to the skilled artisan including, but not limited to, resistive heaters and flow channels. In some embodiments, the substrate support 210 includes a cooling system. The heater 245 or cooling system is connected to a thermal control 247 to control the power or flow rate to control the temperature of the substrate support 210.

Some embodiments of the processing chamber 200 include at least one controller 290 coupled to one or more of the processing chamber 200, substrate support 210, support shaft 214, motor 219, gas inlet 170, or thermal control component 174 in the backing plate 150. In some embodiments, there are more than one controller 290 connected to the individual components and a primary control processor is coupled to each of the separate controller or processors to control the system. The controller 290 may be one of any form of general-purpose computer processor, microcontroller, microprocessor, etc., that can be used in an industrial setting for controlling various chambers and sub-processors.

The at least one controller 290 can have a processor 292, a memory 294 coupled to the processor 292, input/output devices 296 coupled to the processor 292, and support circuits 298 to communication between the different electronic components. The memory 294 can include one or more of transitory memory (e.g., random access memory) and non-transitory memory (e.g., storage).

The memory 294, or a computer-readable medium, of the processor may be one or more of readily available memory such as random access memory (RAM), read-only memory (ROM), floppy disk, hard disk, or any other form of digital storage, local or remote. The memory 294 can retain an instruction set that is operable by the processor 292 to control parameters and components of the system. The support circuits 298 are coupled to the processor 292 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 290 has one or more configurations to execute individual processes or sub-processes to perform embodiments of the disclosure. The controller 290 can be connected to and configured to operate intermediate components to perform the functions of the methods. For example, the controller 290 can be connected to and configured to control one or more of gas valves, actuators, motors, slit valves, vacuum control, etc.

The controller 290 or non-transitory computer readable medium of some embodiments has one or more configurations or instructions selected from a configuration to: rotate the substrate support 210 around a central axis 212; provide a flow of gas into the gas distribution plate 100; control an exhaust valve 242; control a thermal control component 174 in the backing plate 150; measure temperature within the backing plate 150; measure temperature in the reaction space 233; or measure temperature of the substrate support 210.

Additional embodiments of the disclosure are directed to methods of processing a substrate. The temperature of a gas distribution plate 100 having a faceplate 120 and backing plate 150 as described herein is controlled using a thermal control system and one or more temperature sensors for temperature feedback. A gas is flowed into the plenum 157 in the gas distribution plate 100 and into the reaction space 233 of the processing chamber 200.

Further embodiments of the disclosure are directed to non-transitory computer readable medium including instructions, that, when executed by a controller of a processing chamber, cause the processing chamber to perform operations of one or more of: controlling a temperature of a gas distribution plate having a faceplate with a front surface and a back surface defining a thickness and a plurality of apertures extending through the thickness, and a backing plate having a front surface and a back surface defining a thickness, the front surface in contact with the back surface of the faceplate, the front surface of the backing plate including a concave portion to form a plenum bounded by the concave portion and the back surface of the faceplate, and a plurality of thermal elements extending from a concave surface the concave portion and contacting the back surface of the faceplate; or controlling a flow of gas into the plenum of the gas distribution plate.

Figure 8:
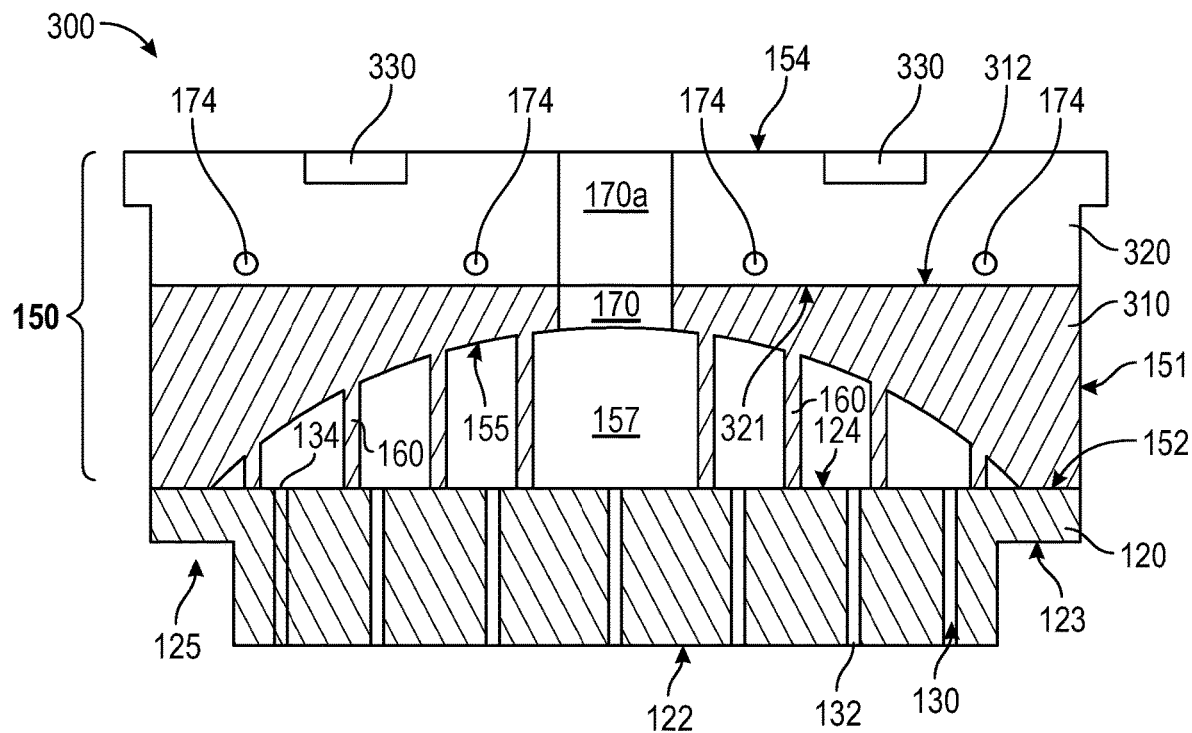
FIG. 8 is a cross-sectional view of a gas distribution plate in accordance with one or more embodiment of the disclosure.

FIG. 8 illustrates another embodiment of a gas distribution plate 300 in which the backing plate 150 is two separate components; a plenum plate 310 and a backing plate cover 320. The plenum plate 310 has a back surface 312 in contact with a front surface 321 of the backing plate cover 320. The plenum plate 310 includes gas inlet 170, the thermal elements 160, concave portion 155 and the plenum 157, as described above with respect to FIG. 2.

In some embodiments, the plenum plate 310 is connected to the backing plate cover 320 using a mechanical fastener. Suitable mechanical fasteners include, but are not limited to bolts, screws, rivets, tape, glue and cement. In some embodiments, the plenum plate 310 is bonded to the faceplate 120. Suitable bonding types include, but are not limited to, solder bonds, welds and crimps.

In some embodiments, the gas distribution plate 300 is two components. A backing plate cover 320 is in contact with, or fastened to, a plenum plate 310. The plenum plate 310 is bonded to a faceplate 120. The skilled artisan will recognize the separation of the two components of the embodiment of FIG. 2 into the corresponding three component embodiment of FIG. 8. Referring still to FIG. 8, in some embodiments, the gas distribution plate 300 comprises a faceplate 120, a plenum plate 310 and a backing plate cover 320. The faceplate 120 has a front surface 122 and a back surface 124 defining a thickness and a plurality of apertures 130 extending through the thickness.

The plenum plate 310 has a front surface 152 and a back surface 312 defining a thickness of the plenum plate 310. The front surface 152 of the plenum plate is in contact with the back surface 124 of the faceplate 120. The front surface 152 of the plenum plate 310 includes a concave portion 155 which forms a plenum with the faceplate 120. The combination of the concave portion 155 of the plenum plate 310 and the back surface 124 of the faceplate 120 forms a cavity which acts as a plenum 157. The gas inlet 170 allows fluid communication between the back surface 312 of the plenum plate 310 and the plenum 157. The plenum plate 310 includes thermal elements 160 extending from the concave surface of the concave portion 155 to contact the back surface 124 of the faceplate 120.

The backing plate cover 320 includes a front surface 321 and a back surface 154 defining a thickness of the backing plate cover 320. The combined thickness of the backing plate cover 320 and plenum plate 310 are equivalent to the thickness of the backing plate 150, as described above.

The back surface 154 of the backing plate cover 320 is the back surface 154 of the backing plate 150, which comprises the plenum plate 310 and backing plate cover 320. The backing plate cover 320 of some embodiments includes thermal control elements to change or control the temperature of the backing plate cover 320, plenum plate 310 and faceplate 120. The thermal control elements include one or more of heaters 374 or cooling channels 330. The backing plate cover 320 includes a gas inlet 170*a* aligned with the gas inlet 170 of the plenum plate 310 to allow fluid communication between the back surface 154 of the backing plate cover 320 to the plenum 157 between the plenum plate 310 and backing plate cover 320.

The shapes of the thermal elements 160 are configured to balance the gas flow through the plenum 157 with the thermal uniformity of the faceplate 120. In some embodiments, the thermal elements 160 have an elongate profile to improve gas flow from the gas inlet 170 to the outer peripheral edge 159 of the plenum 157. FIG. 10 illustrates a bottom view of a plenum plate 310 (or backing plate 150) showing a dotted line 313 representing an angular orientation from the center of plenum plate 310. The plurality of thermal elements 160 are shaped and arranged around the concave portion 155 so that the thermal elements 160 have a smaller cross-sectional area perpendicular to a flow of gas from the center.

FIGS. 11A through 11C illustrate views of the front surfaces 161 of two exemplary thermal elements 160. In FIG. 11A, the thermal element 160 has a rhomboid or diamond-like shape in which a inner edge 361 of the thermal element 160 faces the center of the plenum plate 310. A gas flowing from the gas inlet 170 encounters the inner edge 361 of the thermal element 160 and flows along surfaces 362, 363 to the outer edge 364 of the thermal element 160. Each of the inner edge 361 and outer edge 364 of some embodiments has, independently, a radiused profile (as shown) or a sharp profile. In some embodiments, both the inner edge 361 and outer edge 364 have a radiused profile, as illustrated in FIG. 11A. In some embodiments, both the inner edge 361 and outer edge 364 have a sharp profile, as illustrated in FIG. 11C. In some embodiments, one of the inner edge 361 or outer edge 364 has a radiused profile and the other of the inner edge 361 and outer edge 364 has a sharp profile.

The embodiment illustrated in FIG. 11A has diamond-like shape with four distinct surfaces 362, 363, 367, 368. Surface 362 intersects surface 367 at radiused corner 365 and surface 363 intersects surface 368 at radiused corner 366. The surfaces 362, 363, 367, 368 can be flat between the corners or have a rounded profile. In the embodiment illustrated in FIG. 11B, the thermal element 160 has a football-shaped profile (a prolate spheroid shaped profile) with a distinct inner edge 361 and outer edge 364 and curved surfaces 362, 363 connecting the inner edge 361 to the outer edge 364. The inflection points 371, 372 of the curved surfaces 362, 363 are equivalent to the radiused corners 365, 366 of FIG. 11A.

In some embodiments, as illustrated in FIG. 11C, the thermal element 160 has an oval-shape profile. The inner edge 361 and outer edge 364 are connected by surfaces 362, 363, similar to FIG. 11B. The inflection points 371, 372 are equivalent to the radiused corners 365, 366 of FIG. 11A.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution backing plate comprising a front surface and a back surface defining a thickness, the front surface having a concave portion with a concave surface, a plurality of thermal elements extend from the concave surface to a front surface of the thermal element, each of the front surfaces of the thermal elements are substantially coplanar.

2. The gas distribution backing plate of claim 1, wherein each of the thermal elements has a tapered profile with a flared base at the concave surface of the concave portion and a narrower end at the front surface.

3. The gas distribution backing plate of claim 1, wherein the backing plate has an outer peripheral edge and the concave portion has an outer peripheral edge.

4. The gas distribution backing plate of claim 3, wherein an outer front face ring defined as the front surface of the backing plate between the outer peripheral edge of the concave portion and the outer peripheral edge of the backing plate is substantially flat.

5. The gas distribution backing plate of claim 4, wherein the front surface of the backing plate at the outer front face ring is substantially coplanar with the front surfaces of the thermal elements.

6. The gas distribution backing plate of claim 4, wherein the concave portion has a concave portion diameter $D_C$ less than an outer peripheral diameter $D_P$ of the backing plate to provide a sealing surface at the outer front face ring.

7. The gas distribution backing plate of claim 6, wherein the concave portion diameter $D_C$ is greater than or equal to about 70% of the outer peripheral diameter $D_P$.

8. The gas distribution backing plate of claim 1, wherein the backing plate further comprises a gas inlet providing fluid communication between the back surface of the backing plate and the concave surface.

9. The gas distribution backing plate of claim 8, wherein the gas inlet is at a center of the concave surface.

10. The gas distribution backing plate of claim 9, wherein thermal elements located equidistant from the center have substantially the same length.

11. The gas distribution backing plate of claim 8, wherein the back surface of the backing plate comprises a groove formed around the gas inlet.

12. The gas distribution backing plate of claim 1, wherein the backing plate further comprises a thermal control component within a body of the backing plate to control a temperature of the backing plate and faceplate.

13. The gas distribution backing plate of claim 1, wherein each of the thermal elements has a substantially uniform diameter from the concave portion to the front surface.

14. The gas distribution backing plate of claim 13, wherein the thermal elements extend directly from the concave surface, creating a hard angle at a point of extension from the concave surface.

15. The gas distribution backing plate of claim 13, wherein the thermal elements have a radiused portion at the portion of the thermal element at the concave portion so that the transition from the concave portion to a sidewall of the thermal element is slightly tapered.

16. The gas distribution backing plate of claim 1, wherein the thermal elements have an elongate profile having a smaller cross-sectional area perpendicular to a flow of gas from a center of the concave portion.

17. The gas distribution backing plate of claim 16, wherein the thermal elements have one or more of a diamond-like shape in which an inner edge of the thermal element faces the center.

18. The gas distribution backing plate of claim 16, wherein the thermal elements have a prolate spheroid shaped profile with a distinct inner edge and outer edge and curved surfaces connecting the inner edge to the outer edge.

* * * * *